US012763138B2

(12) United States Patent
Khwa et al.

(10) Patent No.: US 12,763,138 B2
(45) Date of Patent: Oct. 13, 2026

(54) MEMORY DEVICE AND OPERATING METHOD THEREOF

(71) Applicants: TAIWAN SEMICONDUCTOR MANUFACTURING COMPANY, LTD., Hsinchu (TW); NATIONAL TSING HUA UNIVERSITY, Hsinchu City (TW)

(72) Inventors: Win-San Khwa, Taipei City (TW); De-Qi You, Chiayi County (TW); Jui-Jen Wu, Hsinchu (TW); Meng-Fan Chang, Taichung City (TW)

(73) Assignees: TAIWAN SEMICONDUCTOR MANUFACTURING COMPANY, LTD., Hsinchu (TW); NATIONAL TSING HUA UNIVERSITY, Hsinchu City (TW)

( * ) Notice: Subject to any disclaimer, the term of this patent is extended or adjusted under 35 U.S.C. 154(b) by 197 days.

(21) Appl. No.: 18/435,785

(22) Filed: Feb. 7, 2024

(65) Prior Publication Data

US 2025/0252995 A1 Aug. 7, 2025

(51) Int. Cl.
*G11C 11/56* (2006.01)
*G11C 11/54* (2006.01)

(52) U.S. Cl.
CPC .......... *G11C 11/5642* (2013.01); *G11C 11/54* (2013.01); *G11C 11/5635* (2013.01)

(58) Field of Classification Search
CPC ............................ G11C 11/54; G11C 11/5642
USPC .................................................. 365/189.011
See application file for complete search history.

(56) References Cited

U.S. PATENT DOCUMENTS

| | | | | |
|---|---|---|---|---|
| 7,400,540 | B2 | 7/2008 | Hsu et al. | |
| 9,520,184 | B2 | 12/2016 | Yang | |
| 10,001,995 | B2 | 6/2018 | Van Dalen et al. | |
| 2021/0397932 | A1* | 12/2021 | Yudanov | G06N 3/063 |
| 2023/0037044 | A1* | 2/2023 | Khwa | G11C 11/54 |

FOREIGN PATENT DOCUMENTS

| | | | |
|---|---|---|---|
| CN | 111880749 | A | 11/2020 |
| TW | 200717234 | A | 5/2007 |
| TW | 201532050 | A | 8/2015 |
| TW | 202006547 | A | 2/2020 |

* cited by examiner

*Primary Examiner* — Anthan Tran
(74) *Attorney, Agent, or Firm* — Maschoff Brennan

(57) ABSTRACT

A method of operating a memory device is provided, including operations: generating, based on at least one weight stored in a first memory, a weight feature to be stored in a second memory different from the first memory, wherein the weight feature is associated with a number of repetitious bits, that are in neighbor positions of and the same as a most significant bit, in the at least one weight; and accessing, according to the weight feature and an address of the at least one weight, the first memory and the second memory to transmit the at least one weight to a multiply and accumulate circuit for a first neural network layer operation.

20 Claims, 14 Drawing Sheets

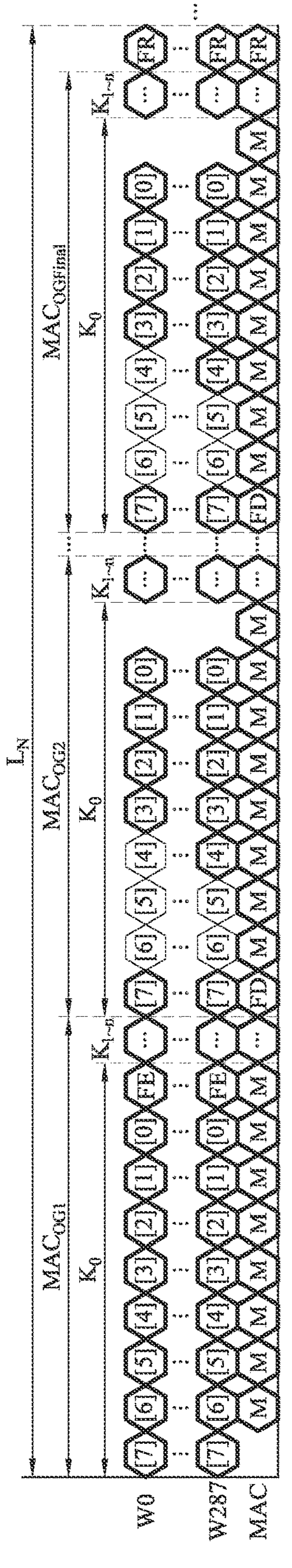
FIG. 5A
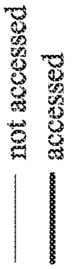

MEMORY DEVICE AND OPERATING METHOD THEREOF

BACKGROUND

Near-memory compute macros, designed to enhance energy efficiency by performing computations close to memory storage, face a significant challenge highlighted in the context of convolutional neural networks (CNNs). The issue lies in the substantial energy consumption attributed to memory readout, where nearly half of the total energy is dedicated to fetching data. In CNNs, all inputs within a layer correspond to the same group of weights, resulting in repetitive memory reads of identical data. This redundancy in data retrieval significantly amplifies energy consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A is a timing diagram of a neural network layer operation corresponding to a medium channel, in accordance with some embodiments of the present disclosure.

DETAILED DESCRIPTION

Figure 1:
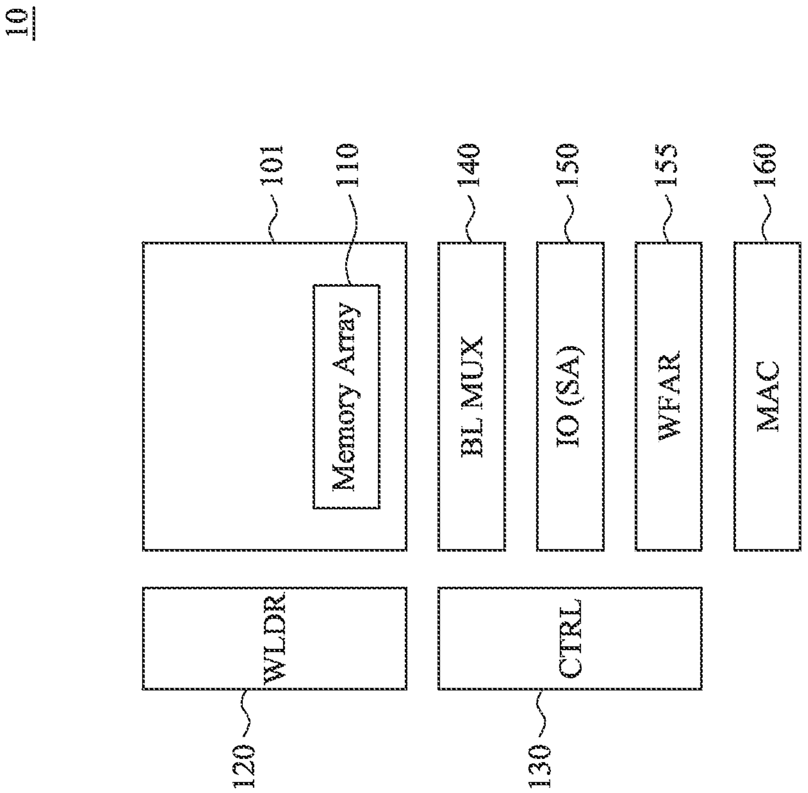
FIG. 1 is a schematic diagram of a memory device in accordance with some embodiments of the present disclosure.

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

According to some embodiments, the present application pertains to a weight read method for optimizing the process in neural network systems by capitalizing on the inherent characteristics of a zero-centered Gaussian weight distribution. Such a distribution is predisposed to exhibit a higher frequency of occurrences in numerical sequences featuring repetitive Os or Is. Specifically, instances of relatively small weight values are prevalent, resulting in numerous leading "1" or "0" occurrences within the 2's complement representation.

The method is introduced to leverage a particular characteristic of weight data, namely the recurring most significant bit (MSB). This approach aims to selectively skip the reading of certain bits during the retrieval process, thereby mitigating the energy consumption associated with each bit read.

The method involves the extraction of the weight feature, manifested as the run-length of the MSB exceeding a predefined threshold, during the initial readout. Subsequently, this information is encoded and stored in memory addresses, forming a record of the weight feature. In certain embodiments, the variation in weight features is contingent upon the quantity of weights accessed across diverse neural network layers. During subsequent readouts, if the read address aligns with an asserted weight feature, the bits linked to the predetermined run-length threshold are systematically omitted. This strategic omission effectively reduces the overall read energy per bit, contributing to enhanced efficiency in neural network operations.

Reference is now made to FIG. 1. FIG. 1 is a schematic diagram of a memory device 10 in accordance with some embodiments of the present disclosure. In some embodiments, the memory device 10 is configured as a compute-in-memory system (CIM) for neural network operations. For illustration, the memory device 10 includes a memory 101, a word line driver 120, a control circuit 130, a bit line multiplexer 140, an input/output circuit 150, a weight feature read circuit 155, and a multiply and accumulate (MAC) circuit 160.

In some embodiments, the memory 101 includes a memory array 110 made up of multiple bitcells referred to as memory cells. The memory cells are at the intersection of a row with a column in the 110. In some embodiments, the memory array 110 can be non-volatile memory array and includes static random access memory (SRAM) cell. In various embodiments, the memory array 110 includes resistive-based random access memory (RAM) cells. Resistive-based RAM can include resistive-RAM (ReRAM), magnetoresistive RAM (MRAM), ferroelectric RAM (FeRAM), dielectric RAM, any suitable array of any suitable memory devices, or combinations thereof. In some embodiments, the memory array 110 is configured to store multiple weights accessed for the neural network.

The word line driver (WLDR) 120 is configured to generate word line signals to drive word lines for accessing the memory array 110 to read/write bits from/into the memory array 110 in response to control signal associated with addresses, in which the addresses indicate some specific memory cells, storing bits, in the memory array 110. Specifically, in some embodiments, the word line driver 120 selects and activates the specific memory cells in the memory array 110 according to the addresses.

The control circuit 130 is configured to control the word line driver 120, the bit line multiplexer 140, the input/output circuit 150, the weight feature read circuit 155 and the multiply and accumulate circuit 160 to perform either traditional memory access (e.g., read and write of specific addresses), as well as CIM operation. In some embodiments, the control circuit 130 includes an x-decoder for the word lines and a y-decoder for the bit lines and/or sensing lines. It also contains timing control for read and write operations. In some embodiments, the control circuit 130 is configured to generate control signals to the word line driver 120, the bit line multiplexer 140, and the input/output circuit 150, and the multiply and accumulate circuit 160 for access operations (e.g., read operation and write operation to the memory array 110) in response to the addresses.

The bit line multiplexer (MUX) 140 is coupled to the memory 101 and is configured to enable columns of the memory array 110 by selecting the bit line (BL) and/or sense line based on the control signal from the control circuit 130. In some embodiments, the bit line multiplexer 140 includes precharge circuitry. For example, in memory access, the precharge circuitry precharges the bit lines for read operations.

The input/output (IO) circuit 150 is configured to transmit data to be written into the memory array 110 and/or to readout data stored in the memory array 110. For example, the input/output circuit 150 transmits weights stored in the memory array 110 to the weight feature read circuit 155 for further application. In some embodiments, the input/output circuit 150 includes sense amplifier circuits for input/output operations from the memory array 110.

The weight feature read circuit 155 is coupled to the input/output circuit 150 and configured to extract weight features of weight in the memory 101. In some embodiments, the weight feature read circuit 155 is further configured to control, according to the extracted weight features, the precharge circuitry in the bit line multiplexer 140 and the sense amplifier circuits in the input/output circuit 150 to access the weight in the memory 101 in read operation of the weight and/or to output weight stored in the weight feature read circuit 155.

In some embodiments, the multiply and accumulate circuit 160 provides the functional units for performing the MAC operation, such as an adder, multiplier, register, etc, based on the weight transmitted from the weight feature read circuit 155.

Figure 2:
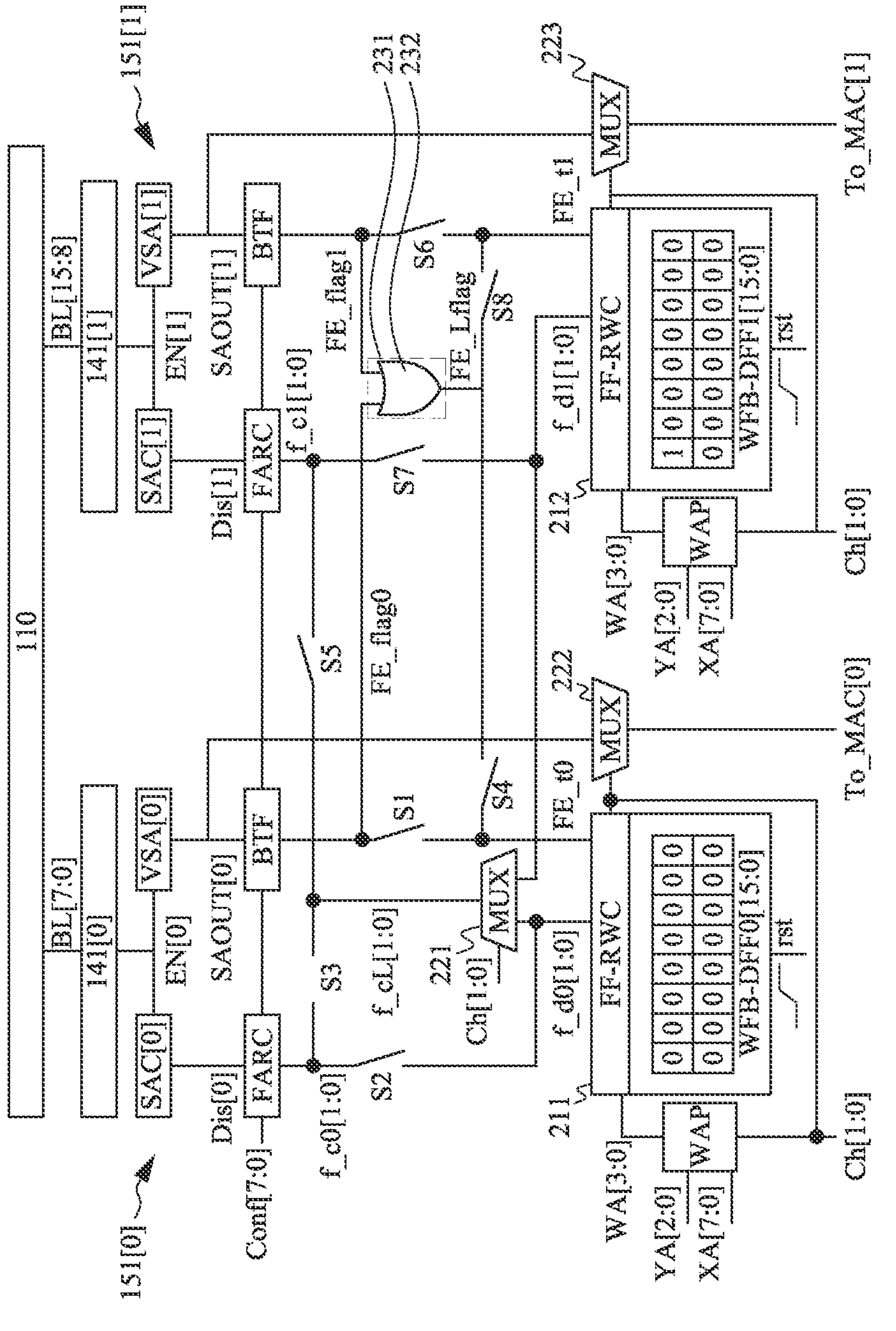
FIG. 2 is a schematic diagram of part of the memory device 10 corresponding to FIG. 1, in accordance with some embodiments of the present disclosure.

Reference is now made to FIG. 2. FIG. 2 is a schematic diagram of part of the memory device 10 corresponding to FIG. 1, in accordance with some embodiments of the present disclosure. With respect to the embodiments of FIG. 1, like elements in FIG. 2 are designated with the same reference numbers for ease of understanding. The specific operations of similar elements, which are already discussed in detail in above paragraphs, are omitted herein for the sake of brevity.

For illustration, the memory array 110 is coupled to local multiplexer and precharge circuits 141[0] and 141[1]. Each of the local multiplexer and precharge circuits 141[0] and 141[1] is coupled to one of sense amplifier circuits 151[0] and 151[1]. In some embodiments, the local multiplexer and precharge circuits 141[0] and 141[1] are configured with respect to, for example, the bit line multiplexer 140 of FIG. 1. The local multiplexer and precharge circuit 141[0] includes a 8-to-1 multiplexer and a precharge circuit that are coupled to bit lines BL0-BL7 for 8-bit data BL [7:0]. The configurations of the local multiplexer and precharge circuit 141[1] are similar to the local multiplexer and precharge circuit 141[0]. Hence, the repetitious descriptions are omitted here.

The sense amplifier circuits 151[0] and 151[1] are configured with respect to, for example, the input/output circuit 150 o FIG. 1, and configured to access the memory array 110. For illustration, the sense amplifier circuit 1510 includes a sense amplifier controller SAC[0] and a sense amplifier VSA[0]. In some embodiments, the sense amplifier controller SAC[0] is configured to control the local multiplexer and precharge circuit 141[0] and the sense amplifier VSA[0] through an enable signal EN[0]. For example, the sense amplifier controller SAC[0] temporarily disables, in response to a disable signal Dis[0], the local multiplexer and precharge circuit 141[0] and the sense amplifier VSA[0] in read operation to access the memory array 110, and further resumes the read operation by enabling the local multiplexer and precharge circuit 141[0] and the sense amplifier VSA [0]. In some embodiments, the sense amplifier VSA[0] is configured to access the memory array 110 to obtain weights from the memory array 110 to generate the readout signal SAOUT[0]. The configurations of the sense amplifier circuit 151[1] are similar to the sense amplifier circuit 151[0]. Hence, the repetitious descriptions are omitted here.

The sense amplifier circuits 151[0] and 151[1] are further coupled to weight read circuits WFAR[0] and WFAR[1] respectively. For illustration, the weight read circuit WFAR [0] includes a weight read controller FARC, a weight extract circuit BTF, a memory circuit 211, and an address decoder WAP. The configurations of weight read circuit WFAR[1] are similar to the weight read circuit WFAR[0]. Hence, the repetitious descriptions are omitted here.

The weight read controller FARC is coupled to the sense amplifier controller SAC[0] and configured to generate, in response to data f_c0[1:0] and data Conf[7:0], the disable signal Dis[0] to the sense amplifier controller SAC[0]. In some embodiments, the control circuit 130 of FIG. 1 is configured to generate the data Conf[7:0] according to the layer that the neural network operation is performed. The detailed configurations are discussed with reference to FIG. 3 to FIG. 10.

The weight extract circuit BTF of the weight read circuit WFAR[0] is coupled to the sense amplifier VSA[0] and further to the memory circuit 211 through a switch S1. In some embodiments, the weight extract circuit BTF of the weight read circuit WFAR[0] generates a signal FE_flag0 according to the readout signal SAOUT[0] received from the sense amplifier VSA[0] and transmits the signal FE_flag0 to the memory circuit 211. In some embodiments, the weight extract circuit BTF extracts weight feature of the weight in the readout signal SAOUT[0] to generate the signal FE_flag0.

The memory circuit 211 includes a control circuit FF-RWC and a flip-flop circuit WFB-DFF. The control circuit FF-RWC is coupled to an address decoder WAP of the weight read circuit WFAR[0] and multiplexers 221 and 222. The control circuit FF-RWC is configured to control read and write operations to the flip-flop circuit WFB-DFF according to a mapping address WA [3:0] and data f_d0[1:0], and further control a reset operation of the flip-flop circuit WFB-DFF according the a signal rst. In some embodiments, the memory circuit 211 generates the data f_c0[1:0] to the weight read controller FARC and data f_d0[1:0] to the multiplexer 221.

The address decoder WAP of the weight read circuit WFAR[0] is configured to generate the mapping address WA [3:0] based on y address YA [2:0] and x address XA[7:0] of the weight stored in the memory array 110. In some embodiments, the address decoder WAP indicates a position of the weight feature, corresponding to the weight, stored in the flip-flop circuit WFB-DFF. The detailed configurations will be discussed in the following paragraphs.

As shown in the embodiments of FIG. 2, the memory circuit 211 is coupled to the weight read controller FARC of the weight read circuit WFAR[0] through a switch S2. The weight read controller FARC is further coupled to the multiplexer 221 through the switch S3. The weight read controller FARC in the weight read circuit WFAR[1] is coupled to the multiplexer 221 through a switch S5, and coupled to the memory circuit 212 in the weight read circuit WFAR[1] through a switch S7. The weight extract circuit BTF of the weight read circuit WFAR[1] is coupled to the memory circuit 212 through a switch S6.

Specifically, the weight read circuit WFAR[1] further includes a logic gate circuit 231. In some embodiments, the logic gate circuit 231 includes an AND gate 232 having a first input coupled to the weight extract circuit BTF of the weight read circuit WFAR[0] and a second input coupled to the weight extract circuit BTF of the weight read circuit WFAR[1]. An output of the AND gate 232 is coupled to the memory circuits 211 and 212 through switches S4 and S8 respectively. In some embodiments, the AND gate 232 is configured to generate signal FE_Lflag based on the signal FE_flag0 and the signal FE_flag1.

Figure 3:
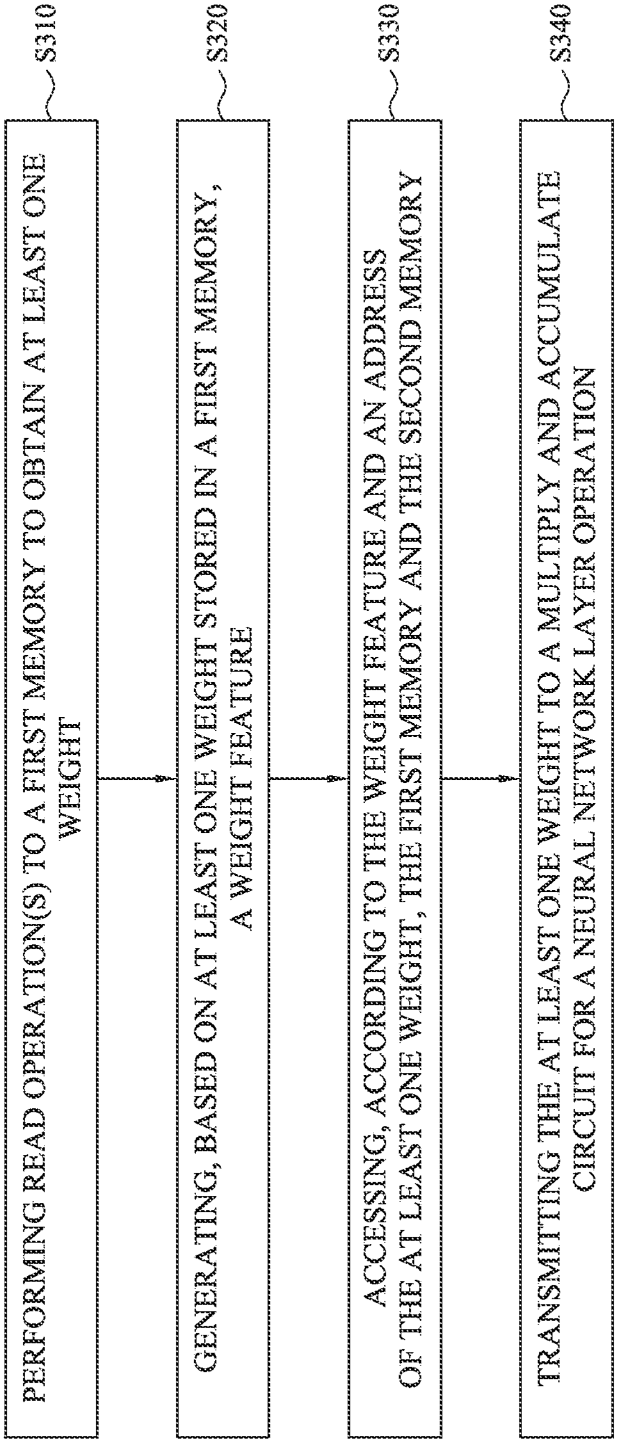
FIG. 3 is a flowchart diagram of a method for operating the memory devices shown in FIG. 1 and FIG. 2, in accordance with some embodiments of the present disclosure.

Reference is now made to FIG. 3. FIG. 3 is a flowchart diagram of a method 30 for operating the memory devices shown in FIG. 1 and FIG. 2, in accordance with some embodiments of the present disclosure. It is understood that additional operations/stages can be provided before, during, and after the processes shown by FIG. 3, and some of the operations/stages described below can be replaced or eliminated, for additional embodiments of the method 30. The method 30 includes operations S310, S320, S330, and S340, and will be discussed in the following paragraphs with reference to FIGS. 1-2 and FIG. 4A to FIG. 10.

In operation S310, as shown in FIG. 3 and FIG. 4A, FIG. 5A, and FIG. 6A, read operation(s) is performed to the memory array 110 to obtain weight(s) stored in the memory array 110 in a multiply and accumulate operation period $MAC_{OG1}$ of a neural network layer operation $L_N$. For example, the weight WO has 8 bits is represented as "00001101" to be stored in memory cells of the memory array 110 coupled to the bit lines BL0 to BL7. The control circuit 130 controls the sense amplifier circuit 151[0] to access the memory array 110 to generate the readout signal SAOUT[0] indicated the weight.

In operation S320, a weight feature is generated based on the weight. In some embodiments, the weight read circuit, for example, WFAR[0] is configured to operate in response to the data Conf[7:0] to extract and store weight feature for various layers in the neural network, in which each layer has different number of weights. For example, as shown in table I below, a layer including a smaller amount of weights, for example, 144 weights, is referred to as a short channel, and the weight read circuit WFAR[0] generates a 8-bit weight feature based on the weight. In another embodiments, a layer including a medium amount of weights, for example, 288 weights, is referred to as a medium channel, and the weight read circuit WFAR[0] generates a 2-bit weight feature. In yet another embodiments, a layer including a relatively large amount of weights, for example, 576 weights, is referred to as a long channel, and the weight read circuit WFAR[0] generates a 1-bit weight feature.

TABLE I

| | Channel (layer) | | | | | | |
|---|---|---|---|---|---|---|---|
| | Short Channel | Medium Channel | | | Long Channel | | |
| | # of bits of weight feature | | | | | | |
| | | 2 bits | | | 1 bit | | |
| | 8 bits | WFB value | Nc | # of Reduce access | WFB value | Nc | # of Reduce access |
| operation | Store | 0 | 0 | 0 | 0 | 0 | 0 |
| | weight in | 1 | 1 | 1 | | | |
| | WFB-DFF | 2 | 2 | 2 | 1 | ≥2 | 2 |
| | | 3 | ≥3 | 3 | | | |

The WFB value corresponds to weight feature to be stored in the memory circuits in the weight read circuit WFAR[0] and/or WFAR[1]. The number Nc corresponds to a predetermined value associated with a number of repetitious bits that are the same as the MSB in the neighbor positions in the weight. Number of Reduce access corresponds to a number of bits in the weight not to be read out from the memory array 110, and will be discussed with reference to FIG. 7 to FIG. 9 later.

Figure 4A:
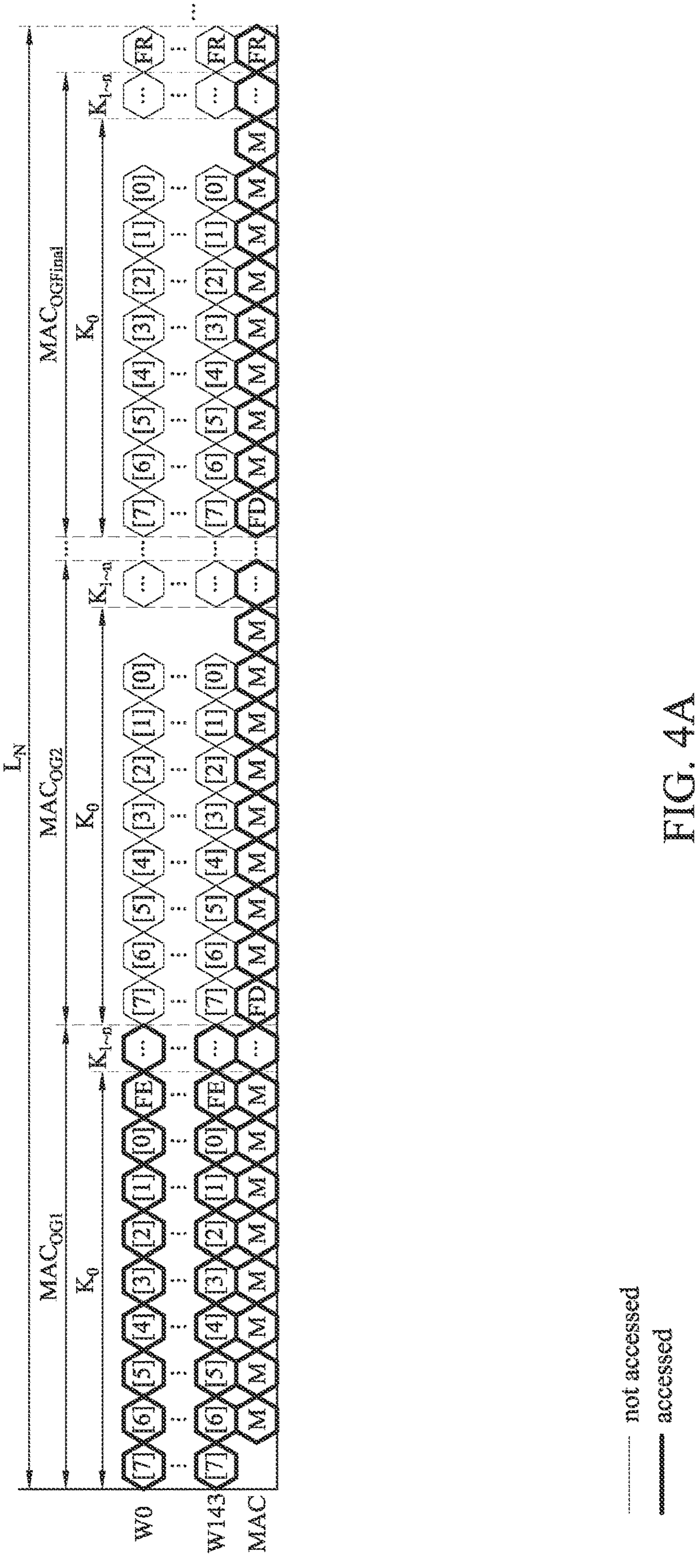
FIG. 4A is a timing diagram of a neural network layer operation corresponding to a short channel, in accordance with some embodiments of the present disclosure.
Figure 4B:
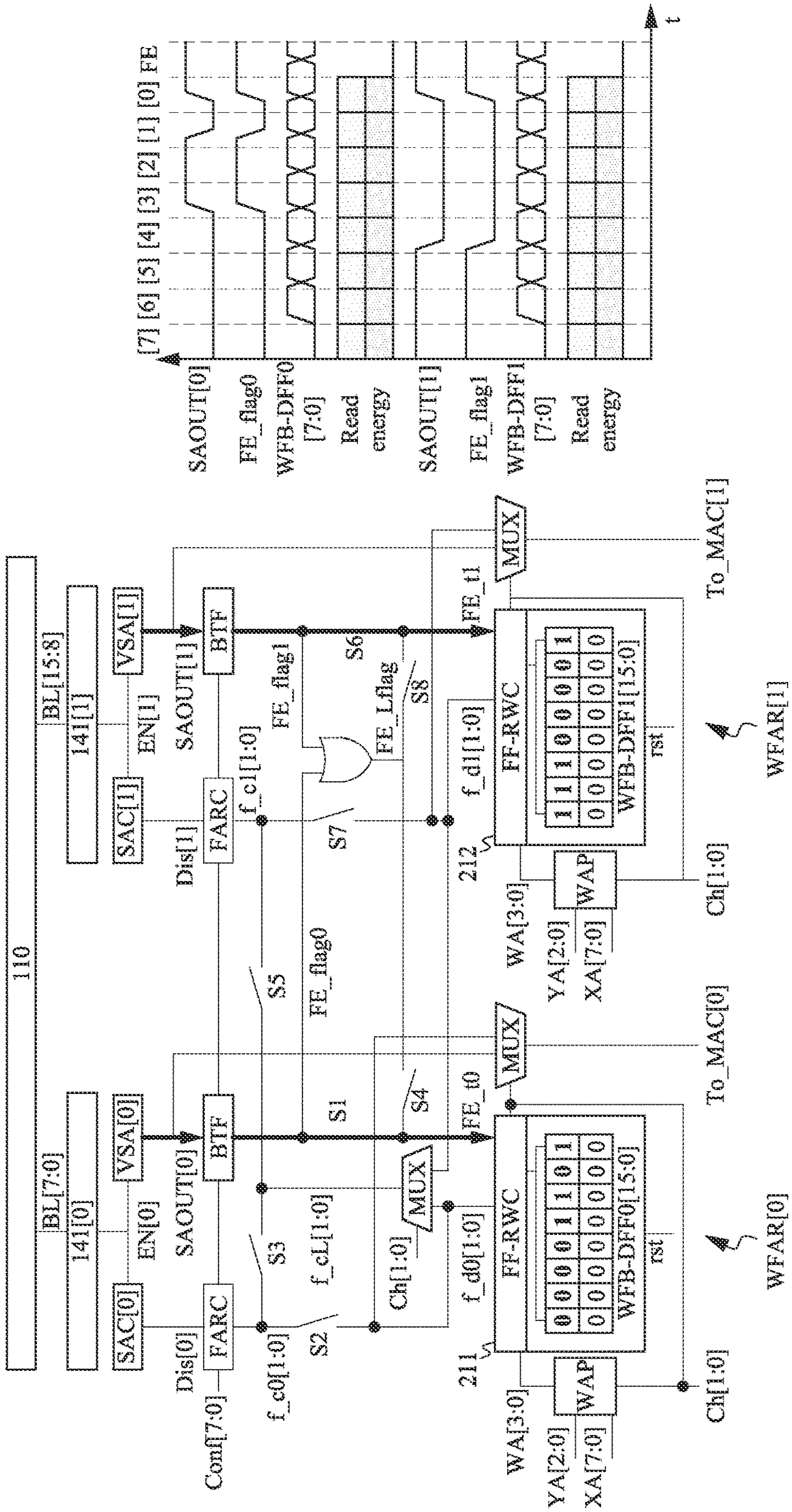
FIG. 4B illustrates operations and signal waveforms of the memory device 10 corresponding to FIG. 4A, in accordance with some embodiments of the present disclosure.

Reference is now made to FIG. 4A to FIG. 4B and table I. For the embodiments of extracting the weight feature of the weight in an extract phase (FE) of the short channel after reading the weight from the memory array 110, the adjacent weight read circuits, for example, WFAR[0] and WFAR[1] operate separately to generate weight features based on the weight (e.g., "00001101") in data BL [7:0] and the weight (e.g., "11100001") in data BL [15:8].

Taking the embodiments of the weight read circuit WFAR [0] as example, the weight extract circuit BTF receives the readout signal SAOUT[0] and transmits the readout signal SAOUT[0] to be the flag signal FE_flag0 to the memory circuit 211 through the turned on switch S1. The control circuit FF-RWC further controls the flip-flop circuit WFB-DFF to store whole 8 bits of weight as the weight feature. Similarly, the weight extract circuit BTF of the weight read circuit WFAR[1] receives the readout signal SAOUT[1] and transmits the readout signal SAOUT[1] to be the flag signal FE_flag1 to the memory circuit 212 through the turned on switch S6. The control circuit FF-RWC in the memory circuit 212 further controls the flip-flop circuit WFB-DFF to store whole 8 bits of weight as the weight feature in a position of the flip-flop circuit WFB-DFF pointed by the corresponding mapping address WA [3:0] generated by the x address XA[7:0] and the y address YA [2:0] of the weight.

Figure 5B:
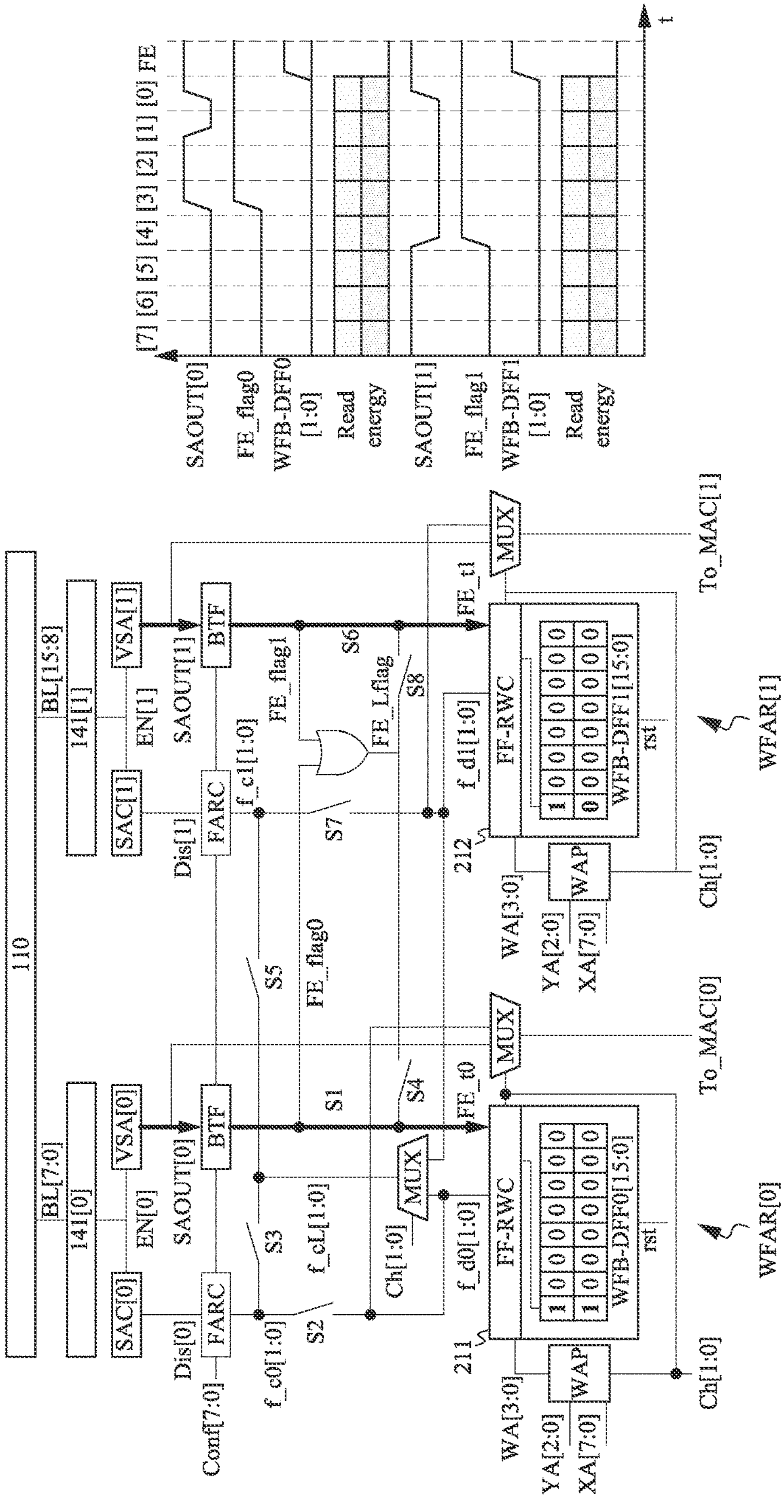
FIG. 5B illustrates operations and signal waveforms of the memory device 10 corresponding to FIG. 5A, in accordance with some embodiments of the present disclosure.

Reference is now made to FIG. 5A to FIG. 5B and table I for extracting weight feature of the weight in an extract phase (FE) of the medium channel after reading the weight from the memory array 110. In some embodiments, the weight extract circuit BTF is configured to generate the flag signal changing from a first voltage level to a second voltage level in response to a bit change of the weight in the readout signal. The control circuit in the memory circuit is further configured to store a weight feature according to the flag signal.

For example, as shown in FIG. 5B, the sense amplifier VSA[0] transmits the readout signal SAOUT[0] featuring the weight "00001101". Specifically, the weight "00001101" has a most significant bit (MSB) "0" and three repetitious bits "000" of the MSB in neighbor positions. The weight extract circuit BTF adjusts the voltage level of the signal FE_flag0 from a low level to a high level in response to a change in the readout signal SAOUT[0] while the eighth bit [7] to the fifth bit [4] of the weight are read as "0" in advance and the fourth bit [3] is "1". In some embodiments, when the number (3) of repetitious bits, the same as the MSB, in the neighbor positions in the weight equal to a predetermined value Nc "3," the control circuit FF-RWC further controls the flip-flop circuit WFB-DFF to store a 2-bit weight feature having "11" in response to the signal FE_flag0, according to table I.

In various embodiments, as shown in FIG. 5B, the sense amplifier VSA[1] transmits the readout signal SAOUT[1] featuring the weight "11100001". Specifically, the weight "11100001" has a most significant bit (MSB) "1" and two repetitious bits "1" of the MSB in neighbor positions. The weight extract circuit BTF adjusts the voltage level of the signal FE_flag1 from a low level to a high level in response to a change in the readout signal SAOUT[1] while the eighth bit [7] to the sixth bit [5] of the weight are read as "1" in advance and the fifth bit [4] is "0". In some embodiments, when the number (2) of repetitious bits, the same as the MSB, in the neighbor positions in the weight equal to another predetermined value Nc "2," the control circuit FF-RWC further controls the flip-flop circuit WFB-DFF to store a 2-bit weight feature having "10" in response to the signal FE_flag1, according to table I.

In some embodiments, when the number (e.g., 4) of repetitious bits exceeds a threshold value, for example, 3, the flip-flop circuit WFB-DFF stores a 2-bit weight feature "11," according to table I.

Figure 6A:
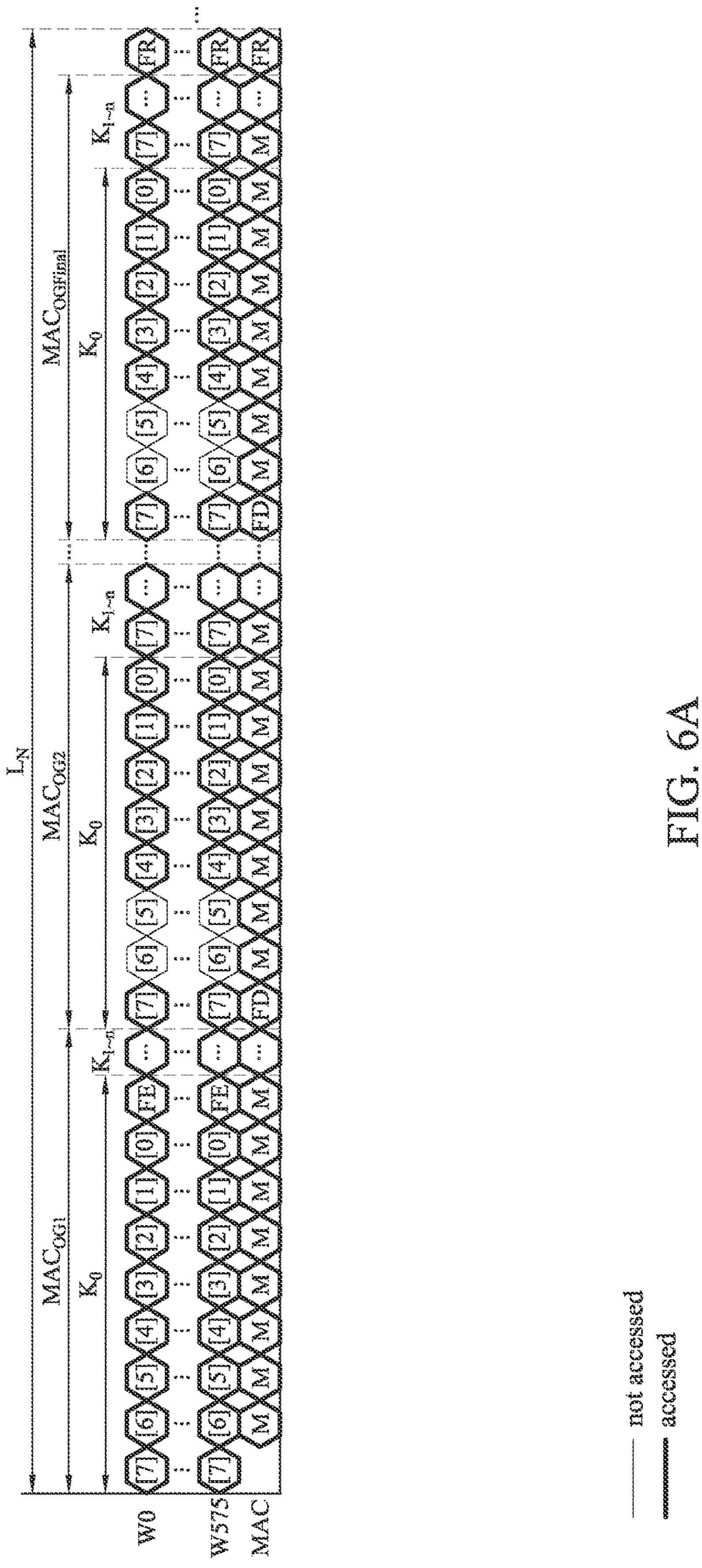
FIG. 6A is a timing diagram of a neural network layer operation corresponding to a long channel, in accordance with some embodiments of the present disclosure.
Figure 6B:
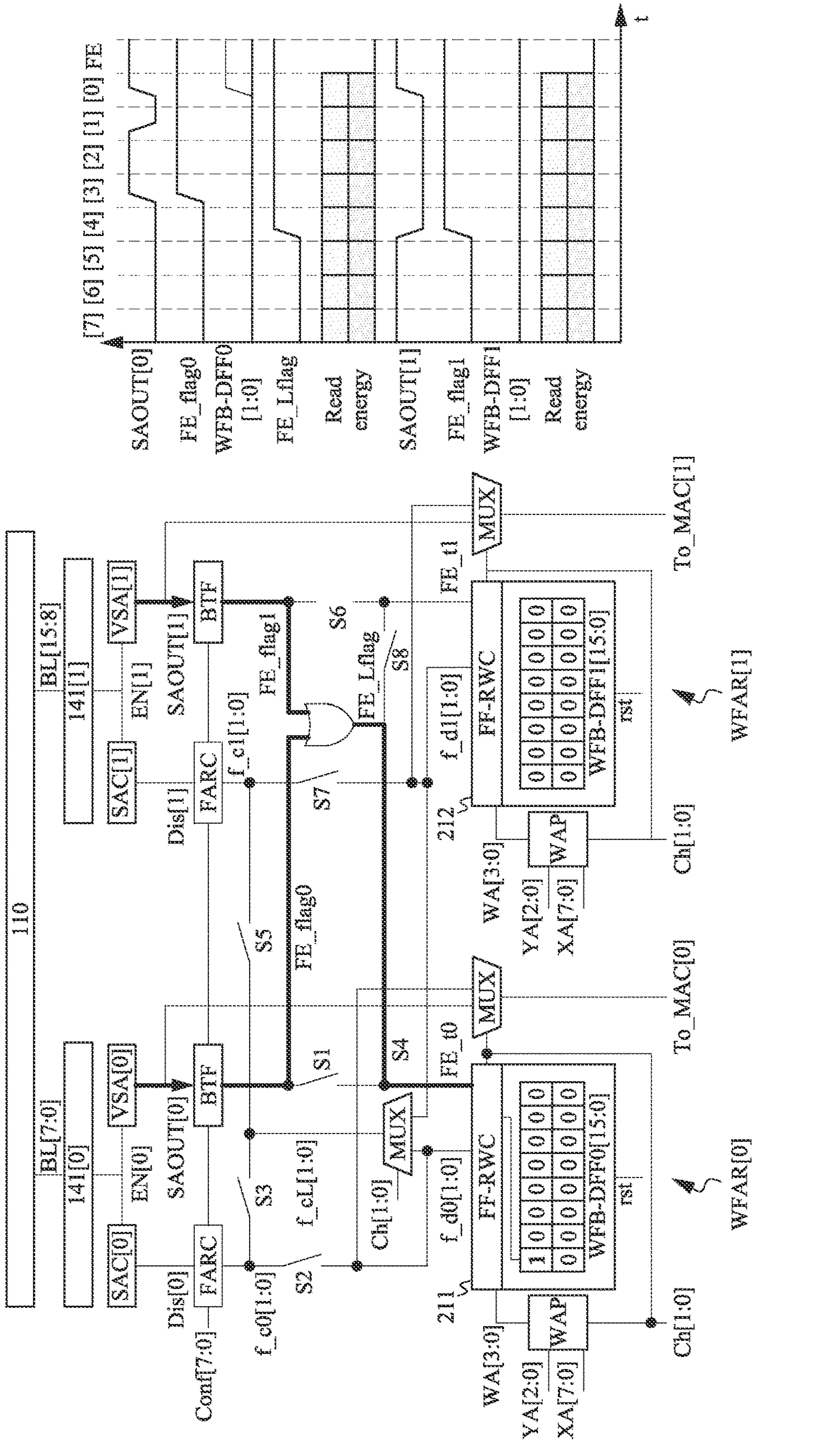
FIG. 6B illustrates operations and signal waveforms of the memory device 10 corresponding to FIG. 6A, in accordance with some embodiments of the present disclosure.

Reference is now made to FIG. 6A to FIG. 6B and table I for extracting weight feature of the weight in an extract phase (FE) of the long channel. In some embodiments, the weight read circuits WFAR[0] and WFAR[1] are configured to cooperate to generate a weight feature based on a first weight from the sense amplifier VSA[0] and a second weight from the sense amplifier VSA[1].

In some embodiments, the configurations of generating the signals FE_flag0 and FE_flag1 are similar to those in FIG. 5A to FIG. 5B. For example, the weight read circuit WFAR[0] determines whether the weight (e.g., "00001101") includes the repetitious bits based on the readout signal SAOUT[0] to generate the signal FE_flag0, and the weight read circuit WFAR[1] determines whether the weight (e.g., "11100001") includes the repetitious bits based on the readout signal SAOUT[1] to generate the signal FE_flag1. The configurations of the determinations are similar to those in FIG. 5A to FIG. 5B. Hence, the repetitious descriptions are omitted here.

As shown in FIG. 6B, the AND gate 232 generates a 1-bit common weight feature by performing an AND operation to the signals FE_flag0 and FE_flag1 from the weight extract circuits BTF in both of the weight read circuits WFAR[0] and WFAR[1]. Because both of the weight "00001101" and the weight "11100001" include at least two repetitious bits the same as the MSB thereof and in the neighbor positions of the MSB, the AND gate 232 transmits the common weight feature "1" to one of the memory circuit, for example, the memory circuit 211, in the weight read circuits WFAR[0] and WFAR[1].

In some embodiments, the WFB value is unequal to the predetermined value Nc. As shown in table II below, in an example of the medium channel, when the WFB value equals to 1 and corresponds to the weight feature "10," the predetermined value Nc equals to N1, in which N1 is unequal to 1, for example, 2. Accordingly, in some embodiments, when the number (e.g., 2) of repetitious bits, the same as the MSB, in the neighbor positions in the weight equal to the predetermined value N1 (e.g., 2,) the control circuit FF-RWC controls the flip-flop circuit WFB-DFF to store a 2-bit weight feature having "10", according to table II. In some embodiments of the medium channel, N1 is the smallest and N3 is the largest among N1 to N3, for example, N1 being 2, N2 being 4, and N3 being 5. In some embodiments of the long channel, N4 can be an arbitrary suitable positive integer, for example, 3. For example, when the WFB value equals to 1 and corresponds to the weight feature "1" and the predetermined value Nc equals to N4, it indicates that the number (e.g., 3) of repetitious bits, the same as the MSB, in the neighbor positions in the weight.

TABLE II

| | Channel (layer) | | | | | | |
|---|---|---|---|---|---|---|---|
| | Short Channel | Medium Channel | | | Long Channel | | |
| | # of bits of weight feature | | | | | | |
| | | 2 bits | | | 1 bit | | |
| | 8 bits | WFB value | Nc | # of Reduce access | WFB value | Nc | # of Reduce access |
| operation | Store | 0 | 0 | 0 | 0 | 0 | 0 |
| | weight in | 1 | N1 | N1 | | | |
| | WFB-DFF | 2 | N2 | N2 | 1 | ≥N4 | N4 |
| | | 3 | ≥N3 | N3 | | | |

With continued reference to FIG. 3, in operation S330, the memory array 110 and the memory circuit, for example, 211 are accessed by, according to the weight feature and the address of the weight, the weight read circuits WFAR[0], WFAR[1], the local multiplexer and precharge circuits 141 [0], 141[1] and the sense amplifier circuits 151[0], 151[1] to transmit the weight to the multiply and accumulate circuit 160 for neural network operation.

Figure 7:
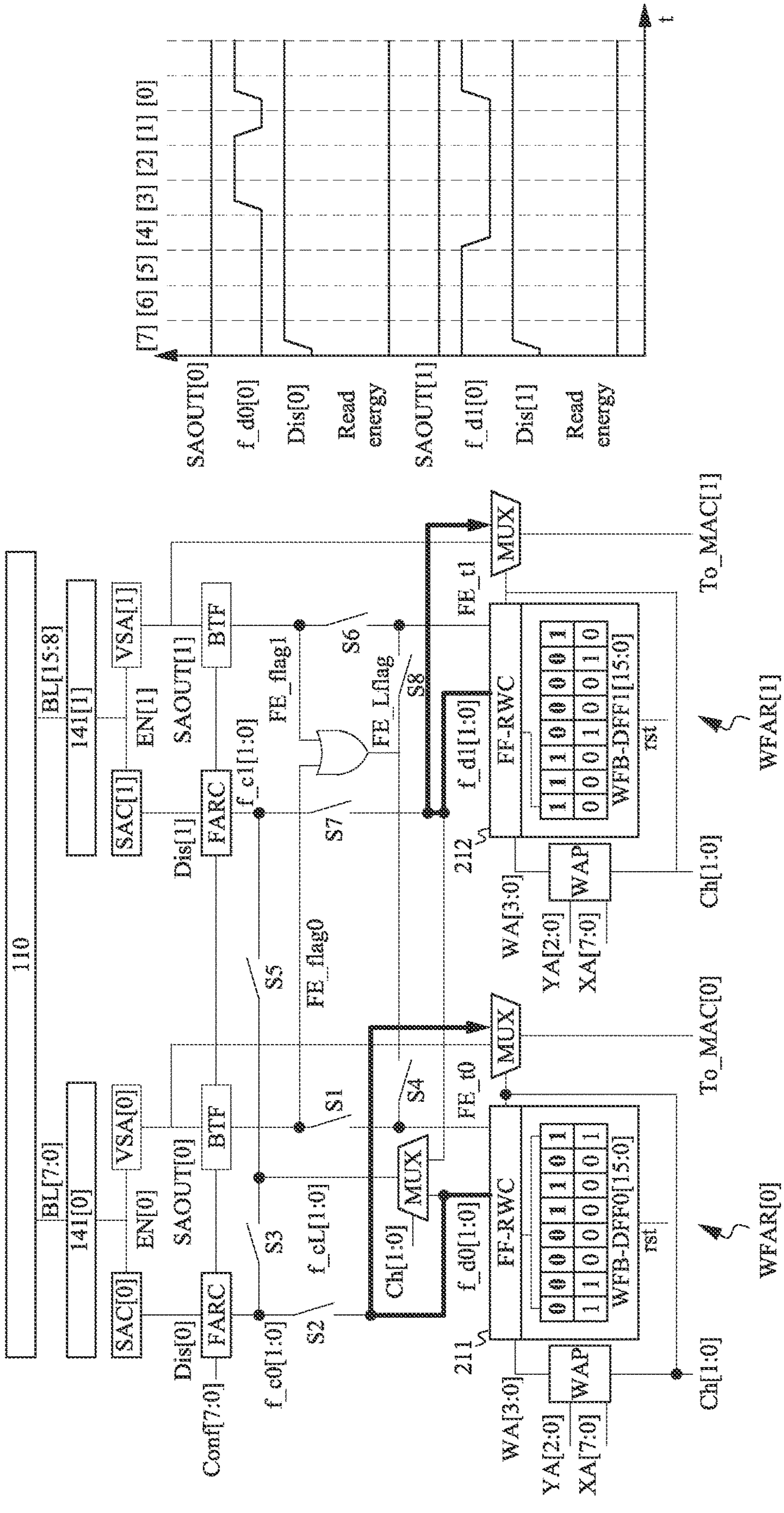
FIG. 7 illustrates operations and signal waveforms of the memory device 10 in neural network layer operation corresponding to a short channel, in accordance with some embodiments of the present disclosure.

For example, for the embodiments of a feature and weight read phase (FD) in the short channel, as shown in FIG. 4A and FIG. 7, the weight read controller FARC in the weight read circuit WFAR[0] generates, in response to the data Conf[7:0] indicating the weight read circuit WFAR[0] operating for weights in the short channel, the disable signal Dis[0] having a high level to the sense amplifier circuit 151[0]. The sense amplifier controller SAC[0] in the sense amplifier circuit 151[0] further generates the enable signal EN[0] in response to the disable signal Dis[0] to disable the local multiplexer and precharge circuit 141 and the sense amplifier VSA[0]. Alternatively stated, the sense amplifier VSA[0] does not access the memory array 110 to obtain weight to generate the readout signal SAOUT[0] in a multiply and accumulate operation period $MAC_{OG2}$, as shown in FIG. 4A. Furthermore, a read operation is performed, in response to the x address XA[7:0] and the y address YA [2:0] of the weight, on the memory circuit 211 to output the weight feature "0001101", as the weight, stored in the memory circuit 211 to the multiply and accumulate circuit 160.

Specifically, the control circuit FF-RWC controls, in response to the mapping address WA [3:0], the flip-flop circuit WFB-DFF to output the data f_d0 including the stored weight feature as the weight to the multiplexer 222. The multiplexer 222 further transmits the data f_d0[0] as the signal To_MAC [0] to the multiply and accumulate circuit 160 in response to the signal Ch [1:0]. In some embodiments, the signal Ch [1:0] is generated by, based on the selected channel (e.g., one of the short channel, the medium channel, and the long channel), the control circuit 130.

The configurations of the weight read circuit WFAR[1] are similar to the weight read circuit WFAR[0]. Hence, the repetitious descriptions are omitted here.

Figure 8:
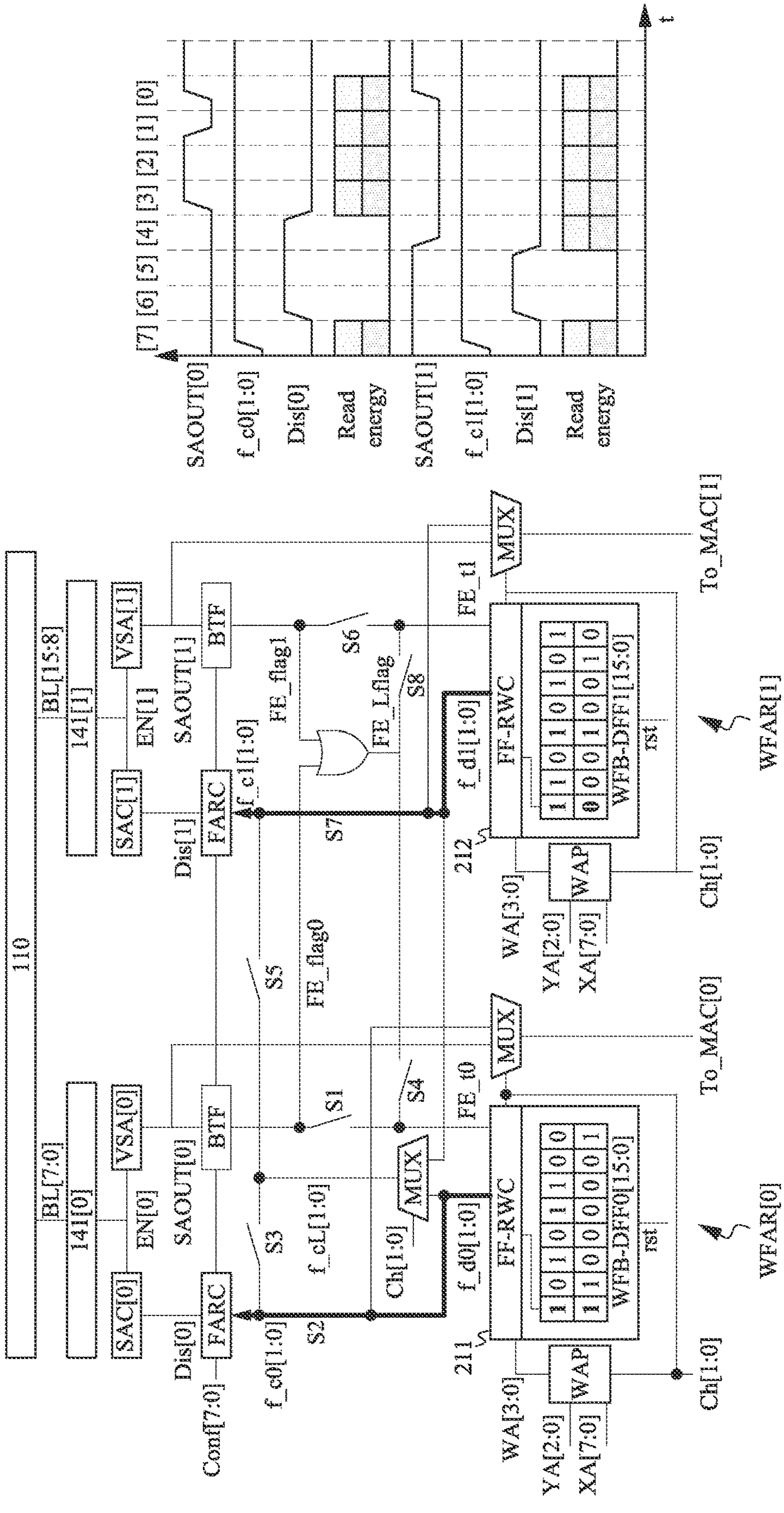
FIG. 8 illustrates operations and signal waveforms of the memory device 10 in neural network layer operation corresponding to a medium channel, in accordance with some embodiments of the present disclosure.

In the embodiments of a feature and weight read phase (FD) in the medium channel, as shown in FIG. 5A and FIG. 8, during a multiply and accumulate operation period $MAC_{OG2}$ for obtaining weight "00001101", a read operation is performed to the memory circuit 211 to obtain the weight feature "11," in which the weight feature "11" indicates three repetitious bits the same as the MSB in the weight to be read and is transmitted through the data f_c0[1:0]. The weight read controller FARC in the weight read circuit WFAR[0] controls, in response to the data Conf[7:0] and the data f_c0[1:0], the local multiplexer and precharge circuit 141[0] and the sense amplifier VSA[0] to perform a read operation to the memory array 110 to read the MSB of the weight to be read, as shown in FIG. 8.

Furthermore, as shown in FIG. 8, instead of reading remaining bits of the weight from the memory array 110, the weight read controller FARC disables, through the disable signal Dis[0], the read operation on the memory array 110 for a number of cycles, for example, 3, according to the weight feature "11" and controls the sense amplifier VSA[0] to output the MSB "0" as portion of bits in the weight. Accordingly, a number "3" of reduce access to the memory array 110 is achieved, saving read energy corresponding to the memory array 110, with reference to table I.

After disabling the local multiplexer and precharge circuit 141[0] and the sense amplifier circuit 151[0] for three cycles, the weight read controller FARC controls resumes the read operation on the memory array 110 to obtain remaining bit data in the weight, for example, "1101" in the weight "00001101."

Similarly, for reading the weight "11100001" by the weight read circuit WFAR[1], instead of reading remaining bits of the weight from the memory array 110, the weight read controller FARC disables, through the disable signal Dis[1], the read operation on the memory array 110 for a number of cycles, for example, 2, according to the weight feature "10" and controls the sense amplifier VSA[1] to output the MSB "1" as portion of bits in the weight. Accordingly, a number "2" of reduce access to the memory array 110 is achieved, saving read energy corresponding to the memory array 110, with reference to table I.

After disabling the local multiplexer and precharge circuit 141[1] and the sense amplifier circuit 151[1] for two cycles, the weight read controller FARC controls resumes the read operation on the memory array 110 to obtain remaining bit data in the weight, for example, "00001" in the weight "11100001."

Figure 9:
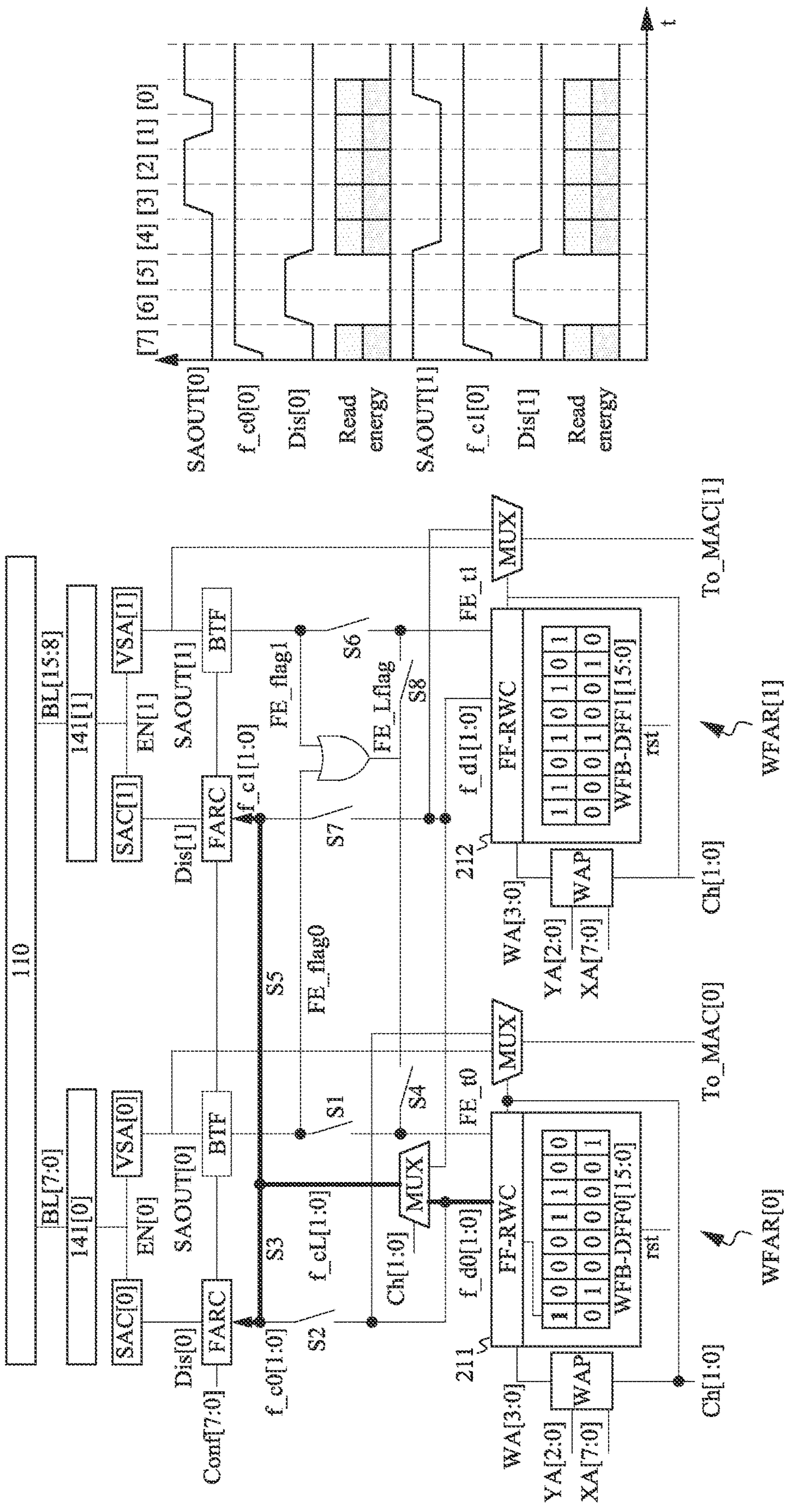
FIG. 9 illustrates operations and signal waveforms of the memory device 10 in neural network layer operation corresponding to a medium channel, in accordance with some embodiments of the present disclosure.
Figure 10:
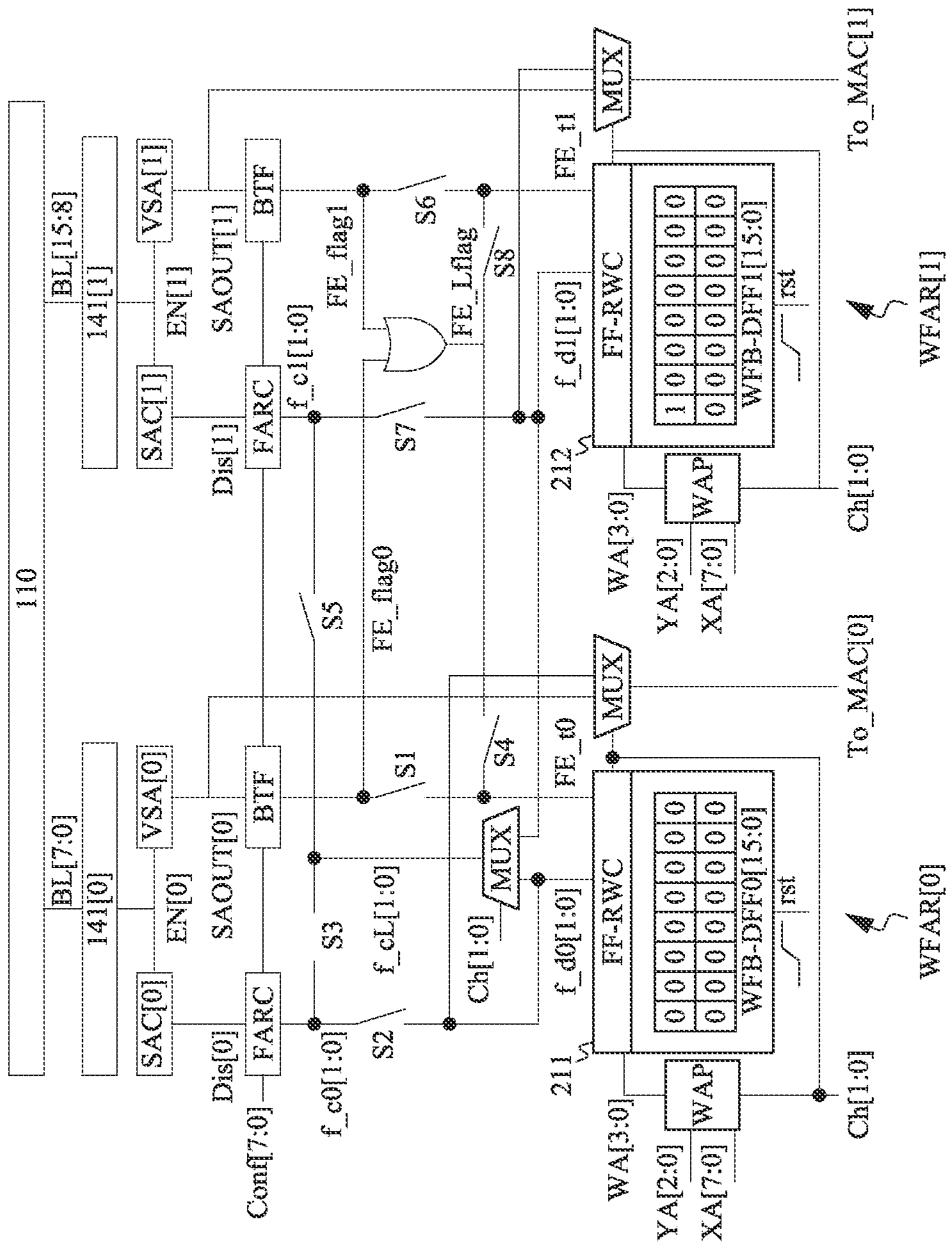
FIG. 10 illustrates operations of the memory device 10 in neural network layer operation, in accordance with some embodiments of the present disclosure.

In the embodiments of a feature and weight read phase (FD) in the long channel, as shown in FIG. 6A and FIG. 9, during a multiply and accumulate operation period $MAC_{OG2}$, the weight read controllers FARC in the adjacent weight read circuits WFAR[0] and WFAR[1] are configured to control the corresponding read operation in response to the same weight feature "1" transmitted through the data f_d0[1:0] by the multiplexer 221.

Specifically, for obtaining weight "00001101" by the weight read circuit WFAR[0], a read operation is performed to the memory circuit 211 to obtain the weight feature "1" through the data f_c0[1:0] based on the data f_cL[1:0] associated with the data f_d0[1:0]. The weight read controller FARC in the weight read circuit WFAR[0] controls, in response to the data Conf[7:0] and the data f_c0[1:0], the local multiplexer and precharge circuit 141[0] and the sense amplifier VSA[0] to perform a read operation to the memory array 110 to read the MSB of the weight to be read. Furthermore, as shown in FIG. 9, instead of reading remaining bits of the weight from the memory array 110, the weight read controller FARC disables, through the disable signal Dis[0], the read operation on the memory array 110 for a number of cycles, for example, 2, according to the weight feature "1" and controls the sense amplifier VSA[0] to output the MSB "0" as portion of bits in the weight. Accordingly, a number "2" of reduce access to the memory array 110 is achieved, saving read energy corresponding to the memory array 110, with reference to table I. After disabling the local multiplexer and precharge circuit 141[0] and the sense amplifier circuit 151[0] for two cycles, the weight read controller FARC controls resumes the read operation on the memory array 110 to obtain remaining bit data in the weight, for example, "01101" in the weight "00001101."

Similarly, for obtaining weight "11100001" by the weight read circuit WFAR[1], a read operation is performed to the memory circuit 211 to obtain the weight feature "1" through the data f_c1[1:0] based on the data f_cL[1:0] associated with the data f_d0[1:0]. The weight read controller FARC in the weight read circuit WFAR[1] controls, in response to the data Conf[7:0] and the data f_c1[1:0], the local multiplexer and precharge circuit 141[1] and the sense amplifier VSA[1] to perform a read operation to the memory array 110 to read the MSB of the weight to be read. Furthermore, as shown in FIG. 9, instead of reading remaining bits of the weight from the memory array 110, the weight read controller FARC disables, through the disable signal Dis[1], the read operation on the memory array 110 for a number of cycles, for example, 2, according to the weight feature "1" and controls the sense amplifier VSA[1] to output the MSB "1" as portion of bits in the weight. Accordingly, a number "2" of reduce access to the memory array 110 is achieved, saving read energy corresponding to the memory array 110, with reference to table I. After disabling the local multiplexer and precharge circuit 141[1] and the sense amplifier circuit 151[1] for two cycles, the weight read controller FARC controls resumes the read operation on the memory array 110 to obtain remaining bit data in the weight, for example, "00001" in the weight "11100001."

In operation S340, the weight read circuit, for example, WFAR[0], transmits the weight to the multiply and accumulate circuit 160 for a neural network layer operation.

In some embodiments, with reference to FIG. 4A, FIG. 5A, FIG. 6A, and FIG. 10, the method 30 further includes operations of resetting the memory circuits, for example, memory circuit 211, to erase the weight feature for a second neural network layer operation. For example, after a final multiply and accumulate operation period $MAC_{OGFinal}$ in multiple multiply and accumulate operation periods of a neural network layer operation $L_N$, the control circuit 130 of FIG. 1 generates the signal rst to the memory circuit 211 to erase data stored in the memory circuit 211. Accordingly, the memory circuit 211 is ready store weight features used in the next neural network layer operation $L_{N+1}$. In some embodiments, the configurations of neural network layer operation $L_{N+1}$ in are similar to the neural network layer operation $L_N$. Hence, the repetitious descriptions are omitted here.

The configurations of FIG. 2 to FIG. 10 are given for illustrative purposes. Various implements are within the contemplated scope of the present disclosure. For example, in the embodiments of FIG. 11, four adjacent weight read circuits WFAR[0] to WFAR[3] are configured to cooperate to generate a weight feature based on a first weight from the sense amplifier VSA[0], a second weight from the sense amplifier VSA[1], a third weight from the sense amplifier VSA[2], and a fourth weight from the sense amplifier VSA[3].

Figure 11:
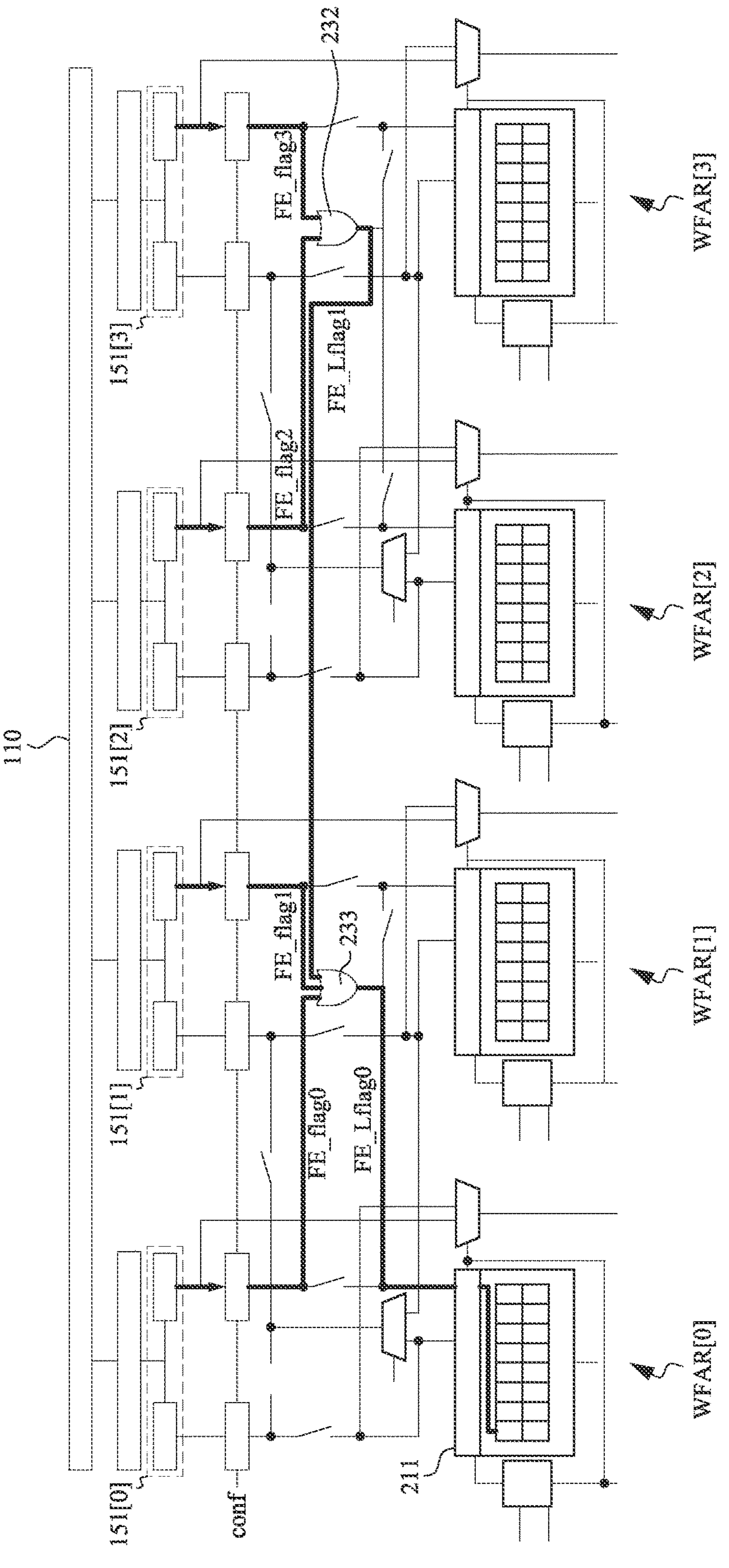
FIG. 11 illustrates operations of the memory device 10 in neural network layer operation, in accordance with some embodiments of the present disclosure.

Specifically, each of the weight read circuits WFAR[0] to WFAR[3] determines whether the corresponding received weight includes repetitious bits based on received readout signal to generate the corresponding one of signals FE_flag0 to FE_flag3. As shown in FIG. 11, the AND gate 232 of the weight read circuit WFAR[3] generates the signal FE_Lflag1 by performing an AND operation to the signals FE_flag2 and FE_flag3 from the weight extract circuits BTF in both of the weight read circuits WFAR[2] and WFAR[3], and further transmits the signal FE_Lflag1 to an AND gate 233 in the weight read circuit WFAR[1]. The AND gate 232 generates a 1-bit common weight feature to be stored in the memory circuit 211 by performing an AND operation to the signals FE_flag0, the signal FE_flag1, and the signal FE_Lflag1.

This application offers a memory device with weight feature extraction for near-memory computation. Additionally, it presents a method to operate the memory device, which involves minimizing the read frequency of non-volatile memory. This is achieved by skipping read operations for repetitive bits matching the most significant bit (MSB) and outputting the MSB based on the extracted weight feature. In contrast to certain approaches, certain neural network models (e.g., ResNet20 and ResNet32 models with CIFAR-100 dataset) save approximately 30% of operational energy per unit area with the configurations of the present application.

A method of operating a memory device is disclosed, including operations: generating, based on at least one weight stored in a first memory, a weight feature to be stored in a second memory different from the first memory, wherein the weight feature is associated with a number of repetitious bits, that are in neighbor positions of and the same as a most significant bit, in the at least one weight; and accessing, according to the weight feature and an address of the at least one weight, the first memory and the second memory to transmit the at least one weight to a multiply and accumulate circuit for a first neural network layer operation.

In some embodiments, generating the weight feature includes transmitting the at least one weight as the weight feature to the second memory.

In some embodiments, accessing the first memory and the second memory includes performing a read operation, in response to the address of the at least one weight, on the second memory to output the stored weight feature to the multiply and accumulate circuit.

In some embodiments, generating the weight feature includes generating the weight feature equal to the number of repetitious bits in the at least one weight.

In some embodiments, generating the weight feature includes when the number of repetitious bits in the at least one weight is equal to a first predetermined value, generating the weight feature having a first value; and when the number of repetitious bits in the at least one weight is greater than a second predetermined value greater than the first predetermined value, generating the weight feature having a second value different from the first value.

In some embodiments, accessing the first memory and the second memory includes: performing a first read operation to the second memory to obtain the weight feature from the second memory; performing a second read operation on the first memory to read a most significant bit of the at least one weight; disabling the second read operation on the first memory for a number of cycles according to the weight feature and outputting the most significant bit as bit data in the at least one weight to the multiply and accumulate circuit; and resuming the second read operation on the first memory to obtain remaining bit data in the at least one weight.

In some embodiments, the at least one weight includes a first weight and a second weight, and generating the weight feature includes determining whether the first weight includes the repetitious bits and determining whether the second weight includes the repetitious bits; and when both of the first and second weights include the repetitious bits, generating the weight feature having non-zero value.

In some embodiments, accessing the first memory and the second memory includes performing a first read operation to the second memory to obtain the weight feature from the second memory; performing a second read operation on the first memory to read a most significant bit of the first weight; disabling the second read operation on the first memory for a number of cycles according to the weight feature and outputting the most significant bit as bit data in the first weight to the multiply and accumulate circuit; and resuming the second read operation on the first memory to obtain remaining bit data in the first weight.

In some embodiments, accessing the first memory and the second memory further includes performing a third read operation to the second memory to obtain the weight feature from the second memory; performing a fourth read operation on the first memory to read a most significant bit of the second weight; disabling the fourth read operation on the first memory for the number of cycles and outputting the most significant bit of the second weight as bit data in the second weight to the multiply and accumulate circuit; and resuming the fourth read operation on the first memory to obtain remaining bit data in the second weight.

In some embodiments, the method further includes resetting the second memory to erase the weight feature for a second neural network layer operation.

Also disclosed is a memory device. The memory device includes a non-volatile memory array configured to store a plurality of weights; a plurality of sense amplifier circuits configured to access the non-volatile memory array; and a plurality of weight read circuits coupled to the plurality of sense amplifier circuits, and each including: a weight extract circuit configured to generate a flag signal in response to a readout signal that is associated with a corresponding one weight and is generated by a corresponding sense amplifier circuit in the plurality of sense amplifier circuits; a memory circuit configured to store a weight feature according to the flag signal; and a weight read controller configured to control, in response to a control data and feature data associated with the weight feature, the corresponding sense amplifier circuit to output a first bit, of the corresponding one weight, as a portion of bits in the corresponding one weight.

In some embodiments, the memory circuit includes a flip-flop circuit.

In some embodiments, the memory device further includes an address decoder configured to generate, based on an address of the corresponding one weight to be read, a mapping address indicating a position of the weight feature stored in the flip-flop circuit. The memory circuit further includes a control circuit configured to control, in response to the mapping address, the flip-flop circuit to output the feature data to the weight read controller. The weight read controller is further configured to disable the corresponding sense amplifier circuit to access the non-volatile memory array when the corresponding sense amplifier circuit outputs the first bit as the portion of bits in the corresponding one weight.

In some embodiments, the first bit is a most significant bit in the corresponding one weight.

In some embodiments, the memory device further includes a logic gate circuit configured to generate a common weight feature according to the flag signals from the weight extract circuits in at least two of the plurality of weight read circuits.

In some embodiments, the logic gate circuit is further configured to transmit the common weight feature to the memory circuit in one of the at least two of the plurality of weight read circuits.

In some embodiments, the memory device further includes a first AND gate configured to generate an output signal according to the flag signals from the weight extract circuits in first and second weight read circuits of the plurality of weight read circuits; and a second AND gate configured to generate a common weight feature according to the output signal from the first AND gate and the flag signals from the weight extract circuits in third and fourth weight read circuits of the plurality of weight read circuits. The second AND gate is further configured to transmit the common weight feature to the memory circuit in one of the first to fourth weight read circuits.

Also disclosed is a method of operating a memory device. The method includes: extracting a weight feature of at least one weight and storing the weight feature in a first memory in a first multiply and accumulate operation period of a neural network layer operation; disabling, based on the weight feature, a sense amplifier to access a second memory for at least one cycle and accessing the first memory, the second memory, or the combination thereof to output the at least one weight in a second multiply and accumulate operation period of the neural network layer operation; and erasing the first memory in a final multiply and accumulate operation period of the neural network layer operation.

In some embodiments, when the neural network layer operation corresponds to a short channel, accessing the first memory, the second memory, or the combination thereof to output the at least one weight includes performing a read operation, in response to an address of the at least one weight, to the first memory to output the weight feature as the at least one weight.

In some embodiments, when the neural network layer operation corresponds to a medium channel or a long channel, disabling, based on the weight feature, the sense amplifier to access a second memory and accessing the first memory, the second memory, or the combination thereof to output the at least one weight includes: performing a read operation to the second memory for a first cycle to obtain a most significant bit of the at least one weight; disabling the sense amplifier for a number of cycles and outputting the most significant bit in the number of cycles; and resuming the read operation to the second memory for a remaining cycles to obtain remaining bits in the at least one weight.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a non-volatile memory array configured to store a plurality of weights;
a plurality of sense amplifier circuits configured to access the non-volatile memory array; and
a plurality of weight read circuits coupled to the plurality of sense amplifier circuits, and each comprising:
a weight extract circuit configured to generate a flag signal in response to a readout signal that is associated with a corresponding one weight and is generated by a corresponding sense amplifier circuit in the plurality of sense amplifier circuits;
a memory circuit configured to store a weight feature according to the flag signal; and
a weight read controller configured to control, in response to a control data and feature data associated with the weight feature, the corresponding sense amplifier circuit to output a first bit, of the corresponding one weight, as a portion of bits in the corresponding one weight.

2. The memory device of claim 1, wherein the memory circuit includes a flip-flop circuit.

3. The memory device of claim 2, further comprising:
an address decoder configured to generate, based on an address of the corresponding one weight to be read, a mapping address indicating a position of the weight feature stored in the flip-flop circuit;
wherein the memory circuit further comprises:
a control circuit configured to control, in response to the mapping address, the flip-flop circuit to output the feature data to the weight read controller,
wherein the weight read controller is further configured to disable the corresponding sense amplifier circuit to access the non-volatile memory array when the corresponding sense amplifier circuit outputs the first bit as the portion of bits in the corresponding one weight.

4. The memory device of claim 1, wherein the first bit is a most significant bit in the corresponding one weight.

5. The memory device of claim 1, further comprising:
a logic gate circuit configured to generate a common weight feature according to the flag signals from the weight extract circuits in at least two of the plurality of weight read circuits.

6. The memory device of claim 5, wherein the logic gate circuit is further configured to transmit the common weight feature to the memory circuit in one of the at least two of the plurality of weight read circuits.

7. The memory device of claim 1, further comprising:
a first AND gate configured to generate an output signal according to the flag signals from the weight extract circuits in first and second weight read circuits of the plurality of weight read circuits; and
a second AND gate configured to generate a common weight feature according to the output signal from the first AND gate and the flag signals from the weight extract circuits in third and fourth weight read circuits of the plurality of weight read circuits,
wherein the second AND gate is further configured to transmit the common weight feature to the memory circuit in one of the first to fourth weight read circuits.

8. A memory device, comprising:
a non-volatile memory array configured to store a plurality of weights;
a plurality of sense amplifier circuits configured to perform read operation of the plurality of weights; and
a plurality of weight read circuits, and each comprising:
a weight extract circuit configured to generate a flag signal based on a readout signal received from a corresponding sense amplifier circuit in the plurality of sense amplifier circuits;
a memory circuit configured to store a weight feature according to the flag signal; and
a weight read controller configured to selectively enable a corresponding sense amplifier circuit to output a subset of bits from a corresponding weight, based on the weight feature.

9. The memory device of claim 8, further comprising:
a logic gate circuit configured to generate a common weight feature according to the flag signals from the weight extract circuits in at least two of the plurality of weight read circuits.

10. The memory device of claim 8, further comprising:
a first AND gate configured to generate an output signal according to the flag signals from the weight extract circuits in a first subset of weight read circuits in the plurality of weight read circuits; and
a second AND gate configured to generate a common weight feature according to the output signal from the first AND gate and the flag signals from the weight extract circuits in a second subset of weight read circuits in the plurality of weight read circuits,
wherein the second AND gate is further configured to transmit the common weight feature to the memory circuit in one of the weight read circuits in the first and second subsets.

11. A memory device, comprising:
a non-volatile memory array configured to store a plurality of weights;
a plurality of sense amplifier circuits configured to access the non-volatile memory array; and
a plurality of weight read circuits coupled to the plurality of sense amplifier circuits, and each comprising:
a weight extract circuit configured to generate a flag signal in response to a readout signal that is associated with a corresponding one weight and is generated by a corresponding sense amplifier circuit in the plurality of sense amplifier circuits;
a memory circuit configured to store a weight feature according to the flag signal; and
a weight read controller configured to control, in response to a control data and feature data associated with the weight feature, the corresponding sense amplifier circuit to output a first bit, of the corresponding one weight, as a portion of bits in the corresponding one weight,
wherein the first bit is a most significant bit in the corresponding one weight.

12. The memory device of claim 11, wherein the memory circuit includes a flip-flop circuit.

13. The memory device of claim 12, further comprising:
an address decoder configured to generate, based on an address of the corresponding one weight to be read, a mapping address indicating a position of the weight feature stored in the flip-flop circuit.

14. The memory device of claim 13, wherein the memory circuit further comprises:

a control circuit configured to control, in response to the mapping address, the flip-flop circuit to output the feature data to the weight read controller.

15. The memory device of claim 14, wherein the weight read controller is further configured to disable the corresponding sense amplifier circuit to access the non-volatile memory array when the corresponding sense amplifier circuit outputs the first bit as the portion of bits in the corresponding one weight.

16. The memory device of claim 11, further comprising:

a logic gate circuit configured to generate a common weight feature according to the flag signals from the weight extract circuits in at least two of the plurality of weight read circuits.

17. The memory device of claim 16, wherein the logic gate circuit is further configured to transmit the common weight feature to the memory circuit in one of the at least two of the plurality of weight read circuits.

18. The memory device of claim 11, further comprising:

a first AND gate configured to generate an output signal according to the flag signals from the weight extract circuits in first and second weight read circuits of the plurality of weight read circuits; and a second AND gate configured to generate a common weight feature according to the output signal from the first AND gate and the flag signals from the weight extract circuits in third and fourth weight read circuits of the plurality of weight read circuits, wherein the second AND gate is further configured to transmit the common weight feature to the memory circuit in one of the first to fourth weight read circuits.

19. The memory device of claim 11, further comprising:

a first AND gate configured to generate an output signal according to the flag signals from the weight extract circuits in first and second weight read circuits of the plurality of weight read circuits; and a second AND gate configured to generate a common weight feature according to the output signal from the first AND gate and the flag signals from the weight extract circuits in third and fourth weight read circuits of the plurality of weight read circuits.

20. The memory device of claim 11, wherein the weight read controller is further configured to disable the corresponding sense amplifier circuit to access the non-volatile memory array when the corresponding sense amplifier circuit outputs the first bit as the portion of bits in the corresponding one weight.

* * * * *